United States Patent
Choung et al.

(10) Patent No.: US 9,474,173 B2
(45) Date of Patent: Oct. 18, 2016

(54) PORTABLE TERMINAL

(71) Applicant: Samsung Electronics Co., Ltd., Gyeonggi-do (KR)

(72) Inventors: Tae-Doo Choung, Seoul (KR); Chang-Youl Lee, Gyeonggi-do (KR); Jung-Nam Moon, Incheon (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 252 days.

(21) Appl. No.: 14/016,449

(22) Filed: Sep. 3, 2013

(65) Prior Publication Data

US 2014/0078710 A1    Mar. 20, 2014

(30) Foreign Application Priority Data

Sep. 14, 2012 (KR) .................. 10-2012-0102331

(51) Int. Cl.
| | |
|---|---|
| G06F 1/16 | (2006.01) |
| H05K 5/02 | (2006.01) |
| H05K 9/00 | (2006.01) |
| H05K 5/00 | (2006.01) |
| H04M 1/02 | (2006.01) |

(52) U.S. Cl.
CPC ........... *H05K 5/0217* (2013.01); *G06F 1/1656* (2013.01); *G06F 1/1658* (2013.01); *H04M 1/0249* (2013.01); *H05K 5/0017* (2013.01); *H05K 9/0007* (2013.01)

(58) Field of Classification Search
CPC ............. H05K 5/0217; H05K 5/0017; H05K 9/0007; H04M 1/2049; H04M 1/0249; G06F 1/1658
See application file for complete search history.

(56) References Cited

U.S. PATENT DOCUMENTS

| | | | | |
|---|---|---|---|---|
| 6,058,024 | A | * | 5/2000 | Lyford ..................... G01R 1/18 174/DIG. 34 |
| 6,101,089 | A | * | 8/2000 | Seto ........................ H05K 1/144 361/679.47 |
| 6,229,993 | B1 | * | 5/2001 | Greenaway ......... H04M 1/0249 361/814 |
| 7,558,054 | B1 | * | 7/2009 | Prest .................... H05K 5/0239 361/679.3 |
| 7,966,785 | B2 | * | 6/2011 | Zadesky ........... B32B 17/10018 239/362 |
| 7,969,748 | B2 | * | 6/2011 | Niederkorn .......... H04B 1/3833 361/756 |
| 8,442,593 | B1 | * | 5/2013 | Kwon ................. H04M 1/0266 455/556.1 |
| 2002/0085709 | A1 | * | 7/2002 | Hsu ..................... H04M 1/0249 379/433.11 |
| 2008/0037765 | A1 | * | 2/2008 | Finney .................... H04M 1/23 379/368 |
| 2009/0059502 | A1 | * | 3/2009 | Filson ................... G06F 1/1601 361/679.27 |
| 2010/0014232 | A1 | * | 1/2010 | Nishimura ........ B29C 45/14073 361/679.3 |
| 2010/0048147 | A1 | * | 2/2010 | Kim ..................... H04M 1/0249 455/90.3 |
| 2010/0259914 | A1 | * | 10/2010 | Lee ........................ H04B 1/3833 361/818 |

(Continued)

FOREIGN PATENT DOCUMENTS

| | | |
|---|---|---|
| CN | 1206199 A | 1/1999 |
| CN | 102037799 A | 4/2011 |

(Continued)

*Primary Examiner* — Courtney Smith
*Assistant Examiner* — Keith Depew
(74) *Attorney, Agent, or Firm* — Cha & Reiter, LLC.

(57) ABSTRACT

Provided is portable terminal. The portable terminal includes: a front housing forming a frame of the portable terminal: a rear housing disposed beneath the front housing, a shield can interposed between the front housing and the rear housing for shielding electromagnetic waves and coupled with the front housing; wherein the rear housing is coupled with the shield can, and wherein the front housing and the rear housing are coupled through the shield can.

18 Claims, 4 Drawing Sheets

(56) References Cited

U.S. PATENT DOCUMENTS

| | | | |
|---|---|---|---|
| 2010/0315570 A1* | 12/2010 | Mathew | G06F 1/1637 349/58 |
| 2011/0027036 A1* | 2/2011 | Park | H04M 1/0249 411/81 |
| 2011/0155445 A1 | 6/2011 | Kwon et al. | |
| 2011/0222214 A1* | 9/2011 | Lan | H05K 5/0017 361/679.01 |
| 2011/0235274 A1* | 9/2011 | Gu | H05K 5/0017 361/692 |

FOREIGN PATENT DOCUMENTS

| | | |
|---|---|---|
| JP | 2010-193218 A | 9/2010 |
| KR | 10-0742734 B1 | 7/2007 |
| WO | 2009/129446 A2 | 10/2009 |

* cited by examiner

FIG.4

PORTABLE TERMINAL

CROSS RELATED APPLICATION

This application claims priority under 35 U.S.C. §119 to an application filed in the Korean Intellectual Property Office on Sep. 14, 2012 and assigned Serial No. 10-2012-0102331, the contents of which are incorporated herein by reference in its entirety.

BACKGROUND

1. Field of the Invention

The present disclosure relates to a housing coupling structure for a portable terminal.

2. Description of the Related Art

Currently, with the development of the electronic communication industry, there are rapid changes in the development of portable terminals, such as a mobile phone, a personal digital assistant, and a digital TV. These devices have become necessary articles of modern life which are an important means for transmitting information.

Figure 1:
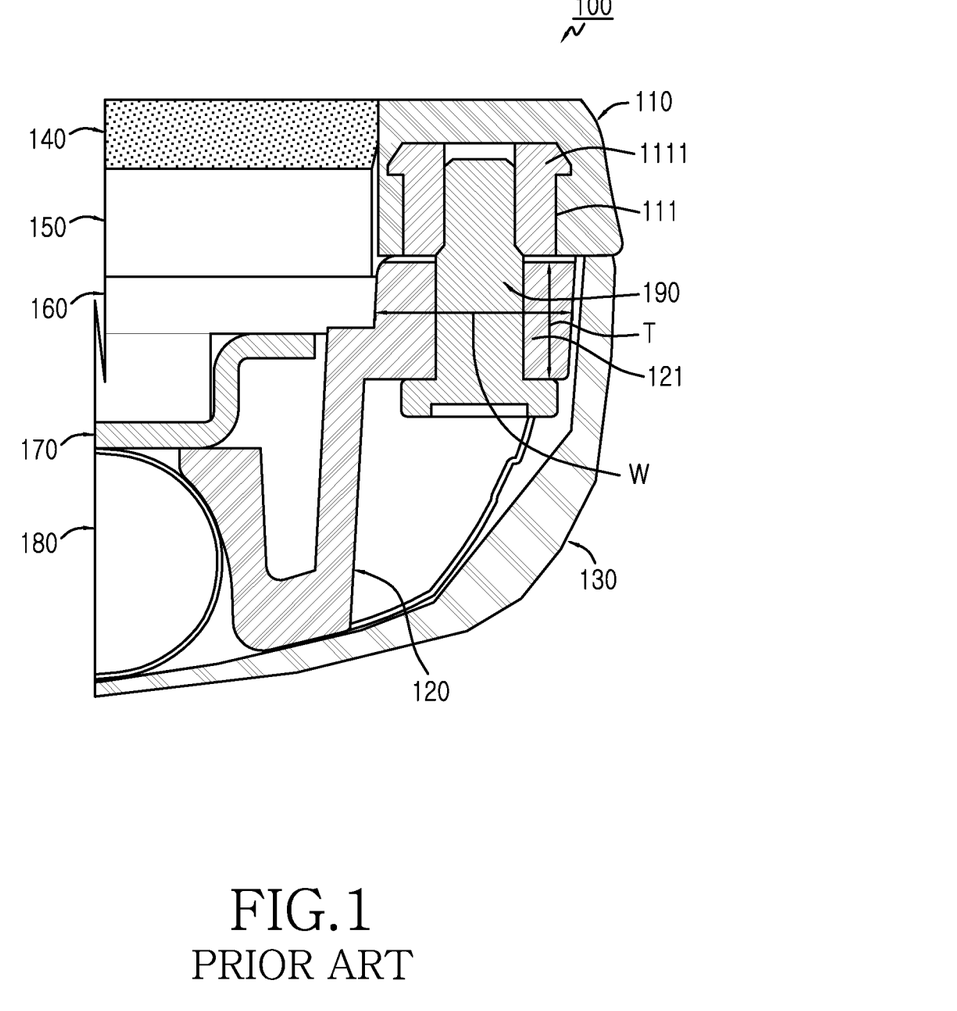
FIG. 1 is a cross-sectional view illustrating a structure of a conventional portable terminal.

FIG. 1 is a cross-sectional view illustrating a structure of a conventional portable terminal.

Referring to FIG. 1, the portable terminal includes a front housing 110, a rear housing 120, and a rear cover 130.

The front housing 110 and the rear housing 120 are coupled to form a space accommodating the internal components of the portable terminal 100. The rear cover 130 covers the rear housing 120. The front housing 110 is disposed in a front side of the portable terminal 100, and the rear cover 130 is disposed in a rear side of the portable terminal 100.

The front housing 110 and the rear housing 120 are coupled to form a container opened toward the front of the portable terminal 100. A window 140, a display 150, a main board 160 and a shield can 170 are sequentially mounted in the space formed by the coupling between the front housing 110 and the rear housing 120. A battery 180 is accommodated in the space formed by the coupling between the front housing 110 and the rear housing 120.

The window 140 is transparent and is exposed toward the front side of the portable terminal 100. The images of the display 150 are displayed through the window 140. The main board 160 is a substrate, in which basic circuits and a plurality of electronic components are mounted. The main board 160 sets an execution environment of the mobile terminal, maintains information thereof, allows the mobile terminal to be stably driven, and allows all units of the mobile terminal to swiftly perform data input/output exchange between the components of the mobile terminal and with other devices. The shield can 170 is mounted on the main board 160 so as to cover the circuits and electronic components of the main board 160 and provide an electromagnetic shield for the electronic components.

The front housing 110 has a boss 111 for screw-coupling with the rear housing 120. The boss 111 has a flanged screw coupling portion 1111 through which a screw hole to be coupled with a screw 190 is formed. The flanged screw coupling portion 1111 is formed of metal and is formed at the front boss 111 typically by use of insert injection molding. The rear housing 120 has a boss coupling hole 121 that is screw-coupled with the boss 111 of the front housing 110. The screw 190 passes through the boss coupling hole 121 of the rear housing 120 and is coupled with the boss 111 of the front housing 110 such that the front housing 110 and the rear housing 120 are coupled together.

The boss coupling hole 121 of the rear housing 120 must have a predetermined width (W) and a predetermined thickness (T), in order to prevent the boss coupling hole 121 from being broken during coupling by the screw 190.

The boss 111 of the front hosing 110 and the boss coupling hole 121 of the rear housing 120 are disposed in the side of the portable terminal, and it is becoming more difficult to maintain the width and thickness of the boss coupling hole 121. The reason for this is that the thicknesses and widths of the front housing 110 and rear housing 120 have been reduced in order to reduce the thickness and width of the portable terminal. Recently, with the increasing use of a potable terminal having a touchscreen, users tend to prefer a larger touchscreen. Therefore, in order to increase the area of the touchscreen while downsizing the portable terminal, there is provided a method of reducing the thickness and width of the front housing 110 and the rear housing 120. Also, for beauty of design, a curvature at the sides of the portable terminals is emerging as an important design factor.

Accordingly, there is a need for a housing coupling structure for a portable terminal, which reduces the thickness or width of the portable terminal, increases design freedom, and provides secure rigidity.

SUMMARY

The present invention substantially solves at least some of the above problems and/or disadvantages and to provide at least the advantages below. Accordingly, an object of the present invention is to provide a housing coupling structure that makes the rigidity of a portable terminal high.

Another aspect of the present invention is to provide a housing coupling structure for a portable terminal that provides a secure strong joint by a screw fixture while reducing the thickness or width of the portable terminal.

Another aspect of the present invention is to provide a housing coupling structure for a portable terminal that provides more space to make a screen larger while at the same time providing for reducing the thickness or width of the portable terminal.

According to a first aspect of the present invention, a portable terminal includes: a front housing; a rear housing disposed beneath the front housing, a shield can interposed between the front housing and the rear housing and shielding electromagnetic waves and coupled with the front housing; and wherein the rear housing is coupled with the shield can, and wherein the front housing and the rear housing are coupled through the shield can.

The front housing and the shield can may form a space accommodating internal components of the portable terminal.

The portable terminal may further include a main board disposed on the shield can; a display disposed on the main board; and a window disposed on the display and in an opening of the front housing wherein a space is formed between the front housing and the shield can for accommodating internal components of the portable terminal.

The front housing may have a boss formed at lower portions of edges of the opening with a screw coupling portion therein for receiving a coupling; the shield can may have a boss coupling hole in alignment with the boss; and wherein a screw may pass through the boss coupling hole of the shield can and may be coupled with the screw coupling portion.

The boss of the front housing and the boss coupling hole of the shield can may be disposed beside the display.

The front housing may have a step formed in a stair shape along an edge of the opening, the boss are formed within the step, and the window are disposed on the step.

The boss of the front housing is located on a surface of the front housing and the boss coupling hole of the shield can is located on a surface of the shield can and wherein the surface of the front housing and the surface of the shield can are disposed facing each other in the portable terminal such that the boss and the boss coupling hole are in alignment with each other.

The shield can may have a shield can boss, the rear housing may have a coupling hole boss in alignment with the shield can boss, and a wherein a screw may pass through the boss coupling hole of the rear housing and are coupled with the boss of the shield can.

The shield can boss and the coupling hole boss are disposed under the main board.

The coupling hole boss is located on a surface of the rear housing and the shield can boss is located on a surface, and wherein the surface of the rear housing and the surface of the shield can are disposed facing each other in the portable terminal such that the coupling hole boss and the shield can boss are in alignment with each other.

The portable terminal may further include a rear cover disposed under the rear housing, and the rear housing and the rear cover may form a space for accommodating a battery.

The rear cover may be coupled with the front housing or the rear housing by using a snap-fit coupling.

The front housing and the rear housing may be formed of molded plastic.

According to another aspect of the present invention, a portable terminal includes: a front housing having an opening; a rear housing disposed under the front housing and coupled with the front housing; a space formed between the front housing and the rear housing; and a window, a display, a main board and a shield can sequentially stacked in a downward direction in the space, wherein the front housing has a step formed in a stair shape at the edges of the opening, the display is disposed on a surface of the step, and a joint between the front housing and the rear housing is disposed under the display.

The joint between the front housing and the rear housing may be disposed beside the main board.

The front housing may have a boss formed at a lower portion of edges of the opening with a screw coupling portion therein for receiving a coupling, the rear housing may have a boss coupling hole, and a screw may pass through the boss coupling hole of the rear housing and may be coupled with the screw coupling portion.

The boss of the front housing is located on a front housing surface and the boss coupling hole is located on a rear housing surface, and wherein the front housing surface and the rear housing surface are disposed facing each other in the portable terminal.

The front housing may further have a second step connected to the step in an inner portion thereof, and the window is disposed on a surface of the second step.

The portable terminal may further include a rear cover disposed under the rear housing, and the rear housing and the rear cover may form a space for accommodating a battery.

The rear cover may be coupled with the front housing or the rear housing by using a snap-fit coupling.

The front housing and the rear housing may be formed of molded plastic.

The housing coupling structure of the portable terminal can increase rigidity, and can reduce the thickness or width of the portable terminal.

BRIEF DESCRIPTION OF THE DRAWINGS

The above objects, features and advantages of the present invention will become more apparent from the following detailed description when taken in conjunction with the accompanying drawings in which.

DETAILED DESCRIPTION

Exemplary embodiments of the present invention will be described herein below with reference to the accompanying drawings to assist in a comprehensive understanding of exemplary embodiments of the invention as defined by the claims and their equivalents. For the purposes of clarity and simplicity, detailed descriptions of well-known functions or configurations will be omitted since they would unnecessarily obscure the subject matters of the present invention by a person of ordinary skill in the art with unnecessary detail of the well-known functions and structures. Also, the terms used herein are defined according to the functions of the present invention. Thus, the terms may vary depending on users' or operators' intentions or practices. Therefore, the terms used herein should be understood based on the descriptions made herein in view of the ordinary level of skill in the art. The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

The present invention relates to a housing coupling structure for an electronic device and the following description is directed to a portable terminal as an example of the electronic device.

Figure 2:
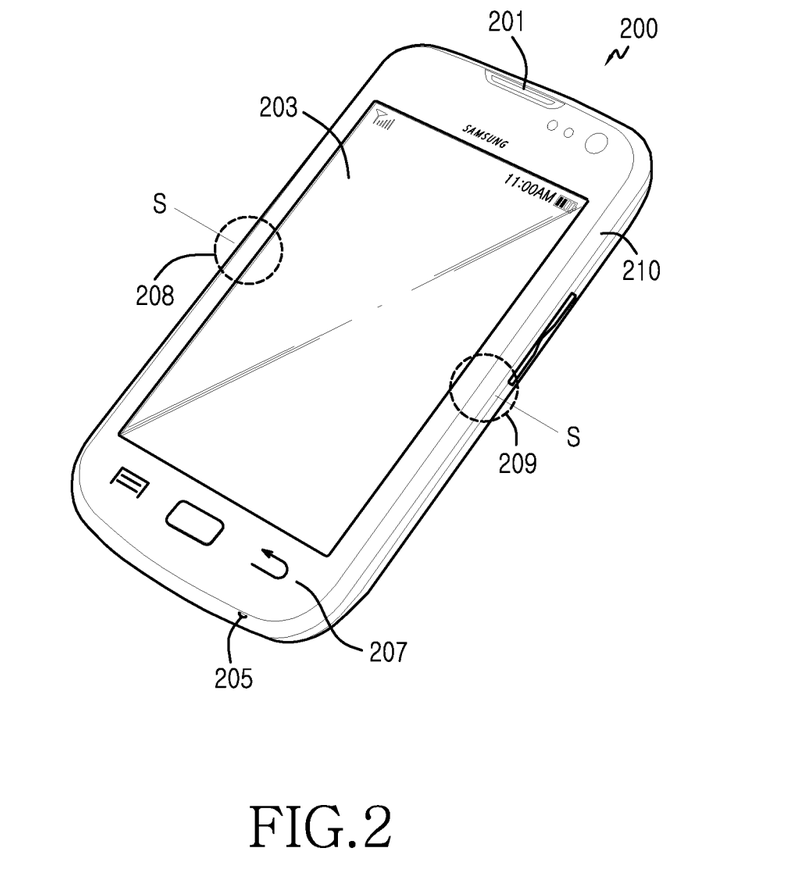
FIG. 2 is a perspective view of a portable terminal according to an exemplary embodiment of the present invention.

FIG. 2 is a perspective view of a portable terminal according to an exemplary embodiment of the present invention.

Referring to FIG. 2, the portable terminal 200 includes a speaker device 201 for outputting sound, a display device 203 disposed in the lower portion of the speaker device 201 for displaying images, a microphone device 205 disposed in the lower portion of the display device 203 for receiving sound input, and a keypad device 207 having input buttons arranged therein.

The display device 203 may be a Liquid Crystal Display (LCD) having several millions of pixels and may be implemented by using a touchscreen when a touch panel is further included.

The portable terminal 200 accommodates the above-described elements, and includes a housing 210 that forms the external appearance and structure of the portable terminal.

The portable terminal according to the present invention provides a housing coupling structure that can increase rigidity.

In addition, the portable terminal according to the present invention provides a housing coupling structure that can secure strong and rigid coupling of the front and rear housings by a screw while reducing the thickness or width thereof.

Furthermore, the portable terminal according to the present invention provides a housing coupling structure that can provide for an increase in a display device screen size while reducing the width of the housing.

The housing coupling structure according to the present invention will be described below in detail with reference to FIGS. 3 and 4.

Figure 3:
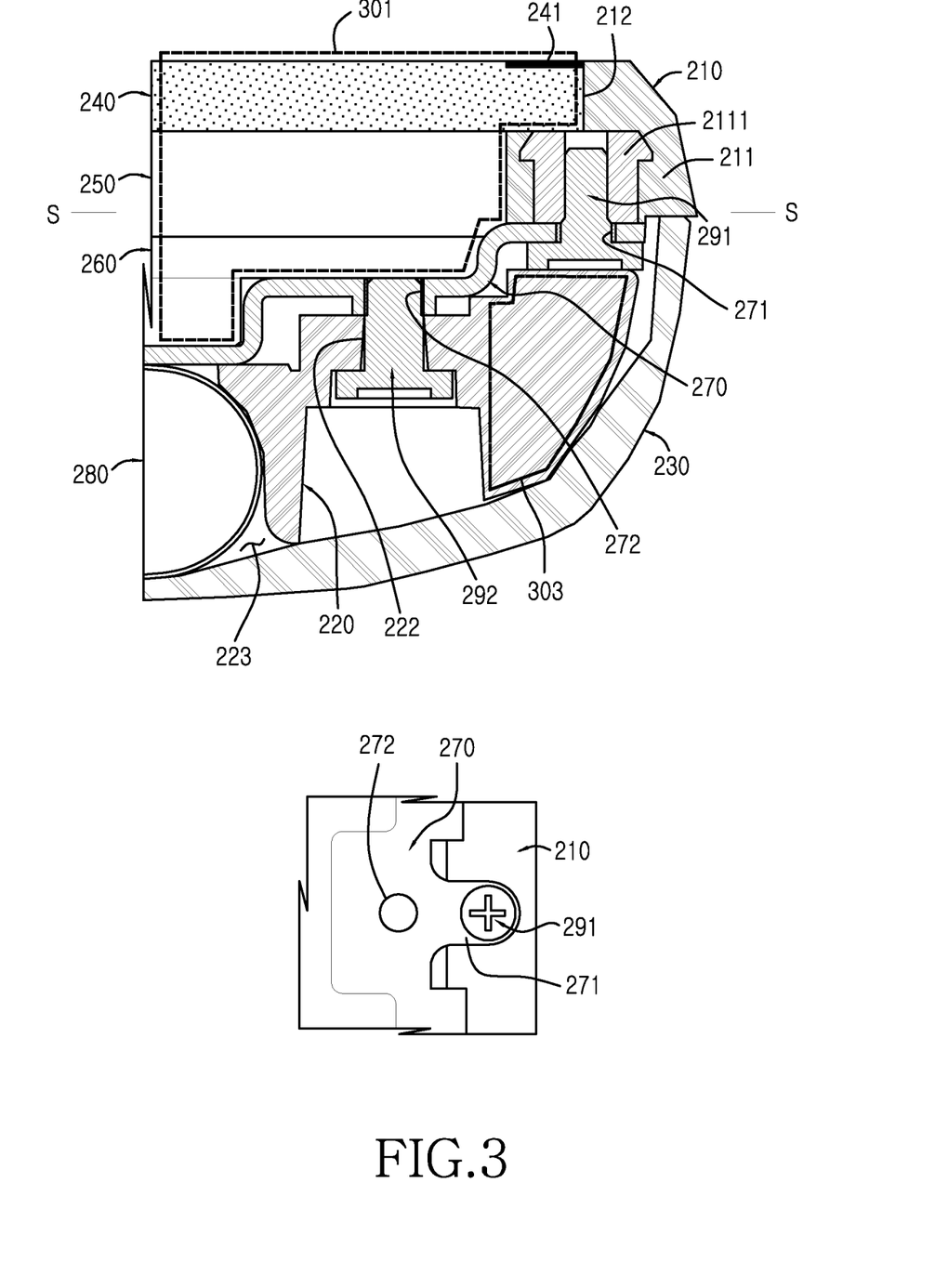
FIG. 3 is a cross-sectional view illustrating a structure of a portable terminal according to an exemplary embodiment of the present invention.

FIG. 3 is a cross sectional view illustrating a structure of a portable terminal according to an embodiment of the present invention.

Referring to FIG. 3, the portable terminal 200 includes a front housing 210, a rear housing 220 and a rear cover 230.

The front housing 210 is coupled with the rear housing 220, and the rear cover 230 covers the rear housing 220. The front housing 210 is disposed at a front side of the portable terminal 200, and the rear cover 230 is disposed at a rear side of the portable terminal 200.

The front housing 210 has an opened shape and forms a frame of the portable terminal 200 for framing other components that will be further described herein.

The front housing 210 and the rear housing 220 are coupled together to form a container opened toward the front of the portable terminal 200.

A window 240, a display 250, a main board 260 and a shield can 270 are disposed in the space formed by the coupling between the front housing 210 and the rear housing 220.

The window 240 is disposed in the opening of the front housing 210, and the display 250 is disposed under the window 240. The main board 260 is disposed under the display 250, and the shield can 270 is disposed under the main board 260.

A battery 280 is accommodated in the space 223 formed by the coupling between the rear housing 220 and the rear cover 230.

The rear cover 230 may be coupled with the front housing 210 or the rear housing 220 by using a predetermined coupling means (not illustrated), such as known screw coupling and snap-fit coupling.

A step 212 is formed in a stair shape at the inner portion of the front housing 210, and the edges of the window 240 are placed on and fixed to the step 212 of the front housing 210. The step 212 of the front housing 210 is formed by the boss 211, and the window 240 is disposed on the boss 211.

The window 240 is transparent and is exposed toward the front side of the portable terminal 200. The images of the display 250 are displayed through the window 240.

The window 240 may further include a printed portion 241 covering the step 212 of the front housing 210.

The main board 260 is a substrate, in which basic circuits and a plurality of electronic components are mounted. The main board 260 sets an execution environment of the mobile terminal, maintains information thereof, allows the mobile terminal to be stably driven, and allows all units of the mobile terminal to swiftly perform data input/output exchange between the components of the mobile terminal and with other devices.

The shield can 270 is formed of metal, and covers the circuits and electronic components on the main board 260 in order to shield electromagnetic waves.

The shield can 270 is disposed between the front housing 210 and the rear housing 220. The shield can 270 is coupled with the front housing 210 through a screw 291 and is coupled with the rear housing 220 through a screw 292.

The front housing 210 has a boss 211 for screw-coupling with the shield can 270. The boss 211 of the front housing 210 has a flanged screw coupling portion 2111 in which a screw hole coupled with the screw 291 is formed. The flanged screw coupling portion 2111 is formed of metal and is formed at the boss 211 through insert injection molding. By positioning boss 211 of the front housing and screw coupling portion 2111 below window 240, a larger window and thus display 250 may be implemented in a device with a design according to the present invention. Moreover, greater rigidity and strength for the closure of the front housing and the rear housing is provided by having both screw 291 and screw 292 for joining the two housings. In this way the clamping closure force required to maintain a rigid connection between the front housing and the rear housing may be distributed more evenly, thus minimizing the risk that the boss coupling hole 271 may be broken. Additional rigidity is provided by coupling screws 291 and 292 with shield can 270.

The shield can 270 has a boss coupling hole 271 for screw-coupling with the boss 211 of the front housing 210.

The screw 291 passes through the boss coupling hole 271 of the shield can 270 and is coupled with the boss 211 of front housing 210 such that the front housing 210 and the shield can 270 are coupled together.

The boss 211 of the front housing 210 and the boss coupling hole 271 of the shield can 270 may be provided in each of the circularly defined areas (208 and 209 in FIG. 2) of two edges facing each other in the portable terminal 200.

In addition, the shield can 270 has a boss 272 for screw-coupling with the rear housing 220.

The rear housing 220 has a boss coupling hole 222 for screw-coupling with the boss 272 of the shield can 270.

The screw 292 passes through the boss coupling hole 222 of the rear housing 220 and is coupled with the boss 272 of the shield can 270 such that the shield can 270 and the rear housing 220 are coupled together.

Accordingly, the shield can 270 is coupled with the front housing 210 and the rear housing 220 such that the front housing 210, the rear housing 220, and the shield can 270 are integrated into one body.

The boss coupling hole 222 of the rear housing 220 and the boss 272 of the shield can 270 may be provided in each of the circularly defined areas (208 and 209 in FIG. 2) of two edges facing each other in the portable terminal 200.

In addition, the front housing 210 and the rear housing 220 may be formed of metal, or may be generally formed of molded plastic.

In a case where the front housing 210 and the rear housing 220 are formed of molded plastic, and the shield can 270 is formed of metal having rigidity, the rigidity of the coupling between front housing 210 and the rear housing 220 can be secured and enhanced through the shield can 270.

The boss 211 of the front housing 210 and the boss coupling hole 271 of the shield can 270 are disposed beside the display 250.

In addition, the boss 272 of the shield can 270 and the boss coupling hole 222 of the rear housing 220 are disposed under the main board 260.

The shield can 270 is disposed under the main board 260, and the boss coupling hole 271 of the shield can 270 extends to the boss 211 of the front housing 210.

The window 240, the display 250, and the main board 260 are accommodated in the space 301 formed by the coupling between the shield can 270 and the front housing 210.

When the portable terminal 200 is made slim, the rear housing 220 may be provided without the portion 303 extending to the boss coupling hole 271 of the shield can 270. Even if the portion 303 is omitted, it is not difficult to secure a thickness for screw-coupling of the boss coupling hole 222 of the rear housing 220.

Figure 4:
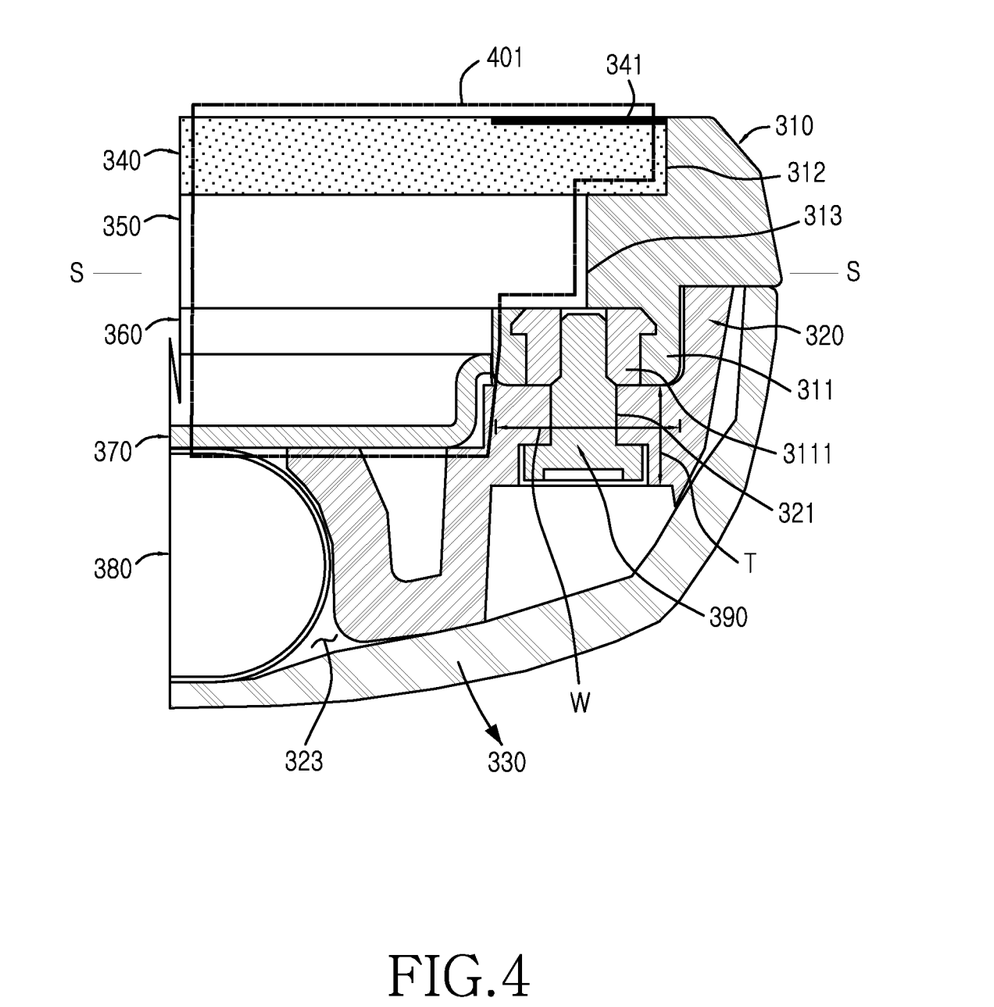
FIG. 4 is a cross-sectional view illustrating a structure of a portable terminal according to another exemplary embodiment of the present invention.

FIG. 4 is a cross-sectional view illustrating a structure of a portable terminal according to another exemplary embodiment of the present invention.

Referring to FIG. 4, the portable terminal 200 includes a front housing 310, a rear housing 320, and a rear cover 330.

The front housing 310 and the rear housing 320 are coupled to form a space 401 accommodating the internal components of the portable terminal 200.

The rear cover 330 covers the rear housing 320. The front housing 310 is disposed in a front side of the portable terminal 200, and the rear cover 330 is disposed in a rear side of the portable terminal 200.

The front housing 310 forms the edges of the portable terminal 200 in an opened shape for framing the components therein.

The front housing 310 and the rear housing 320 are coupled to form a container opened toward the front of the portable terminal 200.

A window 340, a display 350, a main board 360 and a shield can 370 are accommodated in a space 312 formed by the coupling between the front housing 310 and the rear housing 320.

The window 340 is disposed in the opening of the front housing 310, and the display 350 is disposed under the window 340. The main board 360 is disposed under the display 350, and the shield can 370 is disposed under the main board 360.

A battery 380 is disposed in a space 323 formed by the coupling between the rear housing 320 and the rear cover 330.

A step 312 is formed in a stair shape at the inner portion of the front housing 310, and the edges of the window 340 are placed on and fixed to the step 312 of the front housing 310.

The window 340 is transparent and is exposed toward the front side of the portable terminal 200. The images of the display 350 are displayed through the window 340.

The main board 360 is a substrate, in which basic circuits and a plurality of electronic components are mounted. The main board 360 sets an execution environment of the mobile terminal, maintains information thereof, allows the mobile terminal to be stably driven, and allows all units of the mobile terminal to swiftly perform data input/output exchange between the components of the mobile terminal and with other devices.

The shield can 370 is a metal body covering the circuits and electronic components of the main board 360 in order to shield electromagnetic waves, and is fixed to the main board 360.

The front housing 310 has a boss 311 for screw-coupling with the rear housing 320. The boss 311 of the front housing 310 has a flanged screw coupling portion 3111 in which a screw hole coupled with the screw 390 is formed. The flanged screw coupling portion 3111 is formed of metal and is formed at the boss 311 through insert injection molding.

The rear housing 320 has a boss coupling hole 321 for screw-coupling with the boss 311 of the front housing 310.

The screw 390 passes through the boss coupling hole 321 of the rear housing 320 and is coupled with the boss 311 of the front housing 310 such that the front housing 310 and the rear housing 320 are coupled together.

The boss 311 of the front housing 310 and the boss coupling hole 321 of the rear housing 320 are disposed under the display 350 and beside the main board 360. Similarly, the joint between the 311 of the front housing 310 and the boss coupling hole 321 of the rear housing 320 are disposed under the display 350

A step 313 is formed in a stair from at the inner surface of the front housing 310, and the edges of the window 350 are placed on and fixed to the step 313 of the front housing 310. The step 313 of the front housing 310 includes the boss 311, and the display 350 is disposed on the boss 311.

Steps 312 and 313, which are connected in a stair shape, are formed at the inner surface of the front housing 310. The window 340 may further include a printed portion 341 covering the steps 312 and 313 of the front housing 310.

Although the boss coupling hole 321 of the rear housing 320 needs to have a predetermined width (W) and a predetermined thickness (T), the boss coupling hole 321 is not broken during coupling by the screw 390. By placing the boss coupling hole 321 of the rear housing 320, adequate width (W) and thickness (T) can be maintained by placing the boss 311 and the boss coupling hole 321 below the display 350, while still providing room for a larger display 350 and window 340. Thus, greater strength is maintained.

The boss coupling hole 321 of the rear housing 320 according to the present invention is disposed under the display 350, not beside the display 350. When the boss coupling hole 321 of the rear housing 320 is disposed beside the display 350, there is a limitation in reducing the width of the rear housing 320 in order to make the portable terminal slim. However, when the boss coupling hole 321 of the rear housing 320 is disposed under the display 350 according to the present invention, the width and thickness of the boss coupling hole 321 can be sufficiently secured even though the width of the rear housing 320 is reduced in order to make the portable terminal slim.

While the invention has been shown and described with reference to certain exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. An electronic device comprising: a front housing;
a rear housing disposed beneath the front housing;
a shield can interposed between the front housing and the rear housing for shielding electromagnetic waves and coupled with the front housing,
wherein the rear housing is coupled with the shield can; and
wherein the front housing and the rear housing are coupled together on opposite surfaces of the shield can via a fastening member extending from a boss coupling hole of the rear housing through the shield can and into a boss of the front housing;

a main board disposed on the shield can;
a display disposed on the main board; and
a window disposed on the display and in an opening of the front housing,
wherein a space is formed between the front housing and the shield can for accommodating internal components of the electronic device, and wherein both the boss of the front housing and boss coupling hole of the rear housing are arranged below the display.

2. The device of claim 1, wherein
the boss of the front housing includes a screw coupling portion therein for receiving a coupling,
the boss coupling hole of the shield can is in alignment with the boss, and
wherein the fastening member is a screw that passes through the boss coupling hole of the shield can and is coupled with the screw coupling portion.

3. The device of claim 2, wherein the boss of the front housing and the boss coupling hole of the shield can are disposed beside the display.

4. The device of claim 3, wherein
the front housing has a step formed in a stair shape along an edges of the opening,
the boss is formed within the step, and
the window is disposed on the step.

5. The device of claim 2, wherein the boss of the front housing is located on a surface of the front housing and the boss coupling hole of the shield can is located on a surface of the shield can and wherein the surface of the front housing and the surface of the shield can are disposed facing each other in the electronic device such that the boss and the boss coupling hole are in alignment with each other.

6. The device of claim 1, further comprising a shield can boss,
a rear housing boss coupling hole in alignment with the shield can boss, and
wherein a screw passes through the boss coupling hole of the rear housing and is coupled with the boss of the shield can.

7. The device of claim 6, wherein the shield can boss and the rear housing boss coupling hole are disposed under the main board.

8. The device of claim 6, wherein the rear housing boss coupling hole is located on a surface of the rear housing and the shield can boss is located on a surface, and wherein the surface of the rear housing and the surface of the shield can are disposed facing each other in the electronic device such that the rear housing boss coupling hole and the shield can boss are in alignment with each other.

9. The device of claim 1, further comprising a rear cover disposed under the rear housing,
wherein the rear housing and the rear cover forms a space for accommodating a battery.

10. The device of claim 9, wherein the rear cover is coupled with the front housing or the rear housing by using a snap-fit coupling.

11. The device of claim 1, wherein the front housing and the rear housing are formed of molded plastic.

12. An electronic device comprising:
a front housing having an opening;
a rear housing disposed under the front housing and coupled with the front housing;
a space formed between the front housing and the rear housing;
a window, a display, a main board and a shield can sequentially stacked in a downward direction in the space, wherein the front housing has a step formed in a stair shape at the edges of the opening, the display is disposed on a surface of the step, and a joint between the front housing and the rear housing is disposed under the display, wherein the front housing and the rear housing are coupled together on opposite surfaces of the shield can via a fastening member extending from the rear housing through the shield can and into the front housing, and wherein the front housing has a boss formed at a lower portion of edges of the opening with a screw coupling portion therein for receiving a coupling;
the rear housing having a boss coupling hole; and
a screw passes through the boss coupling hole of the rear housing and is coupled with the screw coupling portion, and wherein both the boss of the front housing and boss coupling hole of the rear housing are arranged below the display.

13. The device of claim 12, wherein the joint between the front housing and the rear housing is disposed beside the main board.

14. The device of claim 12, wherein the boss of the front housing is located on a front housing surface and the boss coupling hole is located on a rear housing surface, and wherein the front housing surface and the rear housing surface are disposed facing each other in the electronic device.

15. The device of claim 12, wherein
the front housing further has a second step connected to the step in an inner portion thereof, and
the window is disposed on a surface of the second step.

16. The device of claim 12, further comprising a rear cover disposed under the rear housing,
wherein the rear housing and the rear cover forms a space for accommodating a battery.

17. The device of claim 16, wherein the rear cover is coupled with the front housing or the rear housing by using a snap-fit coupling.

18. The device of claim 12, wherein the front housing and the rear housing are formed of molded plastic.

* * * * *